US007372127B2

(12) United States Patent
Aisenbrey

(10) Patent No.: US 7,372,127 B2
(45) **Date of Patent: *May 13, 2008**

(54) LOW COST AND VERSATILE RESISTORS MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

(*) Notice: Subject to any disclaimer, the term of this patent is extended or adjusted under 35 U.S.C. 154(b) by 166 days.

This patent is subject to a terminal disclaimer.

(21) Appl. No.: 10/883,913

(22) Filed: Jul. 1, 2004

(65) Prior Publication Data

US 2005/0001287 A1 Jan. 6, 2005

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/484,454, filed on Jul. 2, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*H01L 29/00* (2006.01)

(52) U.S. Cl. ................ 257/536; 257/537; 257/E21.004

(58) Field of Classification Search ........ 257/528-543, 257/E21.004
See application file for complete search history.

(56) References Cited

U.S. PATENT DOCUMENTS 2,901,381 A 8/1959 Teal (Continued)

FOREIGN PATENT DOCUMENTS

GB 377449 A 7/2001

OTHER PUBLICATIONS

Co-pending U.S. Patent App. INT-01-002-CIP, filed Dec. 4, 2002, U.S. Appl. No. 10/309,429, "Low Cost Antennas Using Conductive Plastics or Conductive Composites", assigned to the same assignee.

*Primary Examiner*—Cuong Nguyen
(74) *Attorney, Agent, or Firm*—Douglas Schnabel

(57) ABSTRACT

Resistor devices are formed of a conductive loaded resin-based material. The conductive loaded resin-based material comprises micron conductive powder(s), conductive fiber(s), or a combination of conductive powder and conductive fibers in a base resin host. The conductive materials comprise between about 20% and about 50% of the total weight of the conductive loaded resin-based material. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like.

41 Claims, 9 Drawing Sheets

U.S. PATENT DOCUMENTS

| | | | | |
|---|---|---|---|---|
| 3,801,364 | A * | 4/1974 | Kojima et al. | 427/97.5 |
| 4,036,786 | A | 7/1977 | Tiedemann | 252/511 |
| 4,365,230 | A | 12/1982 | Feldman | 338/180 |
| 5,893,765 | A * | 4/1999 | Farnworth | 439/91 |
| 5,973,034 | A * | 10/1999 | Mori et al. | 523/458 |
| 6,194,990 | B1 * | 2/2001 | Lee et al. | 338/320 |
| 6,359,545 | B1 | 3/2002 | Bressers | 338/160 |
| 6,741,221 | B2 * | 5/2004 | Aisenbrey | 343/897 |
| 6,870,516 | B2 * | 3/2005 | Aisenbrey | 343/873 |
| 2003/0197589 | A1 | 10/2003 | Taguchi et al. | 338/306 |
| 2004/0012479 | A1 | 1/2004 | Yamada et al. | 338/307 |

* cited by examiner

LOW COST AND VERSATILE RESISTORS MANUFACTURED FROM CONDUCTIVE LOADED RESIN-BASED MATERIALS

This patent application claims priority to the U.S. Provisional Patent Application 60/484,454, filed on Jul. 2, 2003, which is herein incorporated by reference in its entirety.

This patent application is a Continuation-in-Part of INT01-002CIP, filed as U.S. patent application Ser. No. 10/309,429, filed on Dec. 4, 2002 now U.S. Pat. No. 6,870,516, also incorporated by reference in its entirety, which is a Continuation-in-Part application of, filed as U.S. patent application Ser. No. 10/075,778, filed on Feb. 14, 2002 now U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to resistors and, more particularly, to resistors molded of conductive loaded resin-based materials comprising micron conductive powders, micron conductive fibers, or a combination thereof, homogenized within a base resin when molded. This manufacturing process yields a conductive part or material usable within the EMF or electronic spectrum(s).

(2) Description of the Prior Art

Resistors are a basic building block in electrical and electronic systems. Resistors are based on a fundamental property of a material, namely the resistivity or, inversely, the conductivity of the material. Resistivity, or, conversely conductivity, is based on the relative ability, or inability, of a material to conduct current under a voltage bias. Low resistivity materials permit easy current flow and are typically called conductors. Metals, such as copper and aluminum, are examples of excellent conductors. High resistivity materials permit little or no current flow and are typically called insulators. Metal oxides, ceramics, and air are examples of excellent insulators.

The resistance of an object or device is simply a measure of the ratio of voltage to current in that object or a device. Resistance is defined, electrically, by the equation:

$$\text{Resistance}=\text{Voltage}/\text{Current},$$

and is expressed in Ohms. Resistance depends, mostly, on two factors: (1) the inherent resistivity of the material that makes up the object or device and (2) the physical shape of the device. Resistivity is a material property that is essentially constant, excluding variation due to temperature, for the material once the composition of the material is established. Resistivity (ρ) is expressed in Ohms-cm. The shape of the object is important because actual resistance varies inversely with the available cross sectional area through which current may flow. Resistance may be easily calculated for a simple object once the physical shape and size are known and once the resistivity is known. Resistance is given by:

$$\text{Resistance}=\rho\times(\text{Area}_{cross\text{-}secton}/\text{Length}),$$

where ρ is the material resistivity. Another useful metric for resistance calculation is sheet resistance. Sheet resistance is defined as the resistance of a square area of a material and is particularly useful in technologies, such as integrated circuit devices, where resistor structures have one fixed dimension, such as depth, and two variable dimensions, such as length and width. Sheet resistance is given in ohms/square and may be used to calculate a resistance value using the equation:

$$\text{Resistance}=\text{Sheet Resistance}\times(\text{Length}/\text{Width}).$$

All objects, even metal conductors, have a measurable resistance value across the object. In a metal conductor, this value is usually considered to be an undesirable feature and is termed “parasitic resistance.” In other cases, the resistance value is not only desired but, further, it is essential to correct operation of the electrical or electronics circuit. In this case the object or device is typically called a resistor. A resistor comprises two terminals, or connection points to the rest of the circuit, that are separated by the resistor bulk region. Resistors are constructed using a variety of techniques and materials.

Resistors may be categorized in a number of ways. For example, resistors may be discrete devices or may be integrated devices. Discrete resistors are manufactured as individual devices and then placed into, or onto, a circuit. Typically, discrete resistors are further electrically and mechanically attached by soldering. Integrated resistors are formed as part of the fabrication process of the overall circuit. For example, in a semiconductor integrated circuit device, a resistor may be formed by as a patterned line in a polysilicon layer where this same polysilicon layer is also fabricated into a transistor gate in another location on the circuit. This type of resistor is completely integrated into the design and manufacture of the article.

Resistor devices are manufactured using any of several approaches in the art. Film resistors are formed by covering a ceramic substrate with a resistive film. Carbon films and metal films, such as nichrome, are frequently used to create high value, low current resistors. Metal oxide resistors are formed by oxidizing a chemical, such as tin-chloride, on a ceramic substrate. Carbon composition resistors comprise a bulk piece of carbon-based material into which terminals are embedded. Wire wound resistors comprise a long metal wire that is wound around a core and encased in an insulator.

Resin-based polymer materials are used in many arts for the manufacture of a wide array of articles. These polymer materials combine many outstanding characteristics, such as excellent strength to weight ratio, corrosion resistance, electrical isolation, and the like, with an ease of manufacture using a variety of well-established molding processes. Many resin-based polymer materials have been introduced into the market to provide useful combinations of characteristics. However, most resin-based polymer materials are electrical insulators. Attempts to increase the conductivity of resin-based materials have been made in the art. However, the manufacture of useful resistors from resin-based materials has not been successful, to date, in the art. An important object of the present invention is to provide a new type of resistor device from a resin-based material.

Several prior art inventions relate to resistors and methods of manufacturing resistors. U.S. Patent Publication US 2003/0197589 A1 to Taguchi et al. teaches a variable resistor and its means of production. The resistor is formed on a substrate by means of screen printing and utilizes a thermosetting binder resin, a solvent for dissolving the binder resin, and carbon black as the conductive filler. U.S. Patent Publication US 2004/0012479 A1 to Yamada et al teaches a method of manufacturing a chip resistor with a superior surge property. U.S. Pat. No. 4,365,230 to Feldman teaches a lead screw type variable resistor wherein the lead screw is a conductive plastic and acts as a resistive element. U.S. Pat.

No. 2,901,381 to Teal teaches a method of manufacture for film resistors. U.S. Pat. No. 6,359,545 B1 to Bressers teaches an adjustable resistor with a slider made of conductive rubber or a conductive plastic and formed with dual resistance strips. U.S. Pat. No. 4,036,786 to Tiedemann teaches a resistor comprising a fluorinated carbon composition as the essential conductive component. This invention also teaches 35% by weight of a conductive filler comprising partially fluorinated acetylene black and utilizes a polysulfone resin as the base resin.

SUMMARY OF THE INVENTION

A principal object of the present invention is to provide effective and very manufacturable resistors.

A further object of the present invention is to provide resistors comprising conductive loaded resin-based material.

A further object of the present invention is to provide both discrete and integrated resistors comprising conductive loaded resin-based material.

A further object of the present invention is to provide methods to form resistors of conductive loaded resin-based material.

A further object of the present invention is to provide methods to form both discrete and integrated resistors.

A yet further object of the present invention is to provide resistors molded of conductive loaded resin-based material and further incorporating a metal layer to provide improved connectivity.

A yet further object of the present invention is to provide methods to fabricate resistors from a conductive loaded resin-based material incorporating various forms of the material.

A yet further object of the present invention is to provide a method to fabricate resistors from a conductive loaded resin-based material where the material is in the form of a fabric.

In accordance with the objects of this invention, a resistor device is achieved. The devices comprise a resistive element of a conductive loaded, resin-based material comprising conductive materials in a base resin host. A first terminal is connected at a first end of the resistor element. A second terminal is connected at a second end of the resistor element.

Also in accordance with the objects of this invention, a resistor device is achieved. The resistor device comprises a resistive element of a conductive loaded, resin-based material further comprising conductive materials in a base resin host. The conductive materials comprise between 20% and 40% of the total weight of the conductive loaded resin-based material. A first terminal connected at a first end of the resistor element. A second terminal connected at a second end of the resistor element.

Also in accordance with the objects of this invention, a method to form a resistive element device is achieved. The method comprises providing a conductive loaded, resin-based material further comprising conductive materials in a resin-based host. The conductive loaded, resin-based material is molded into a resistive element device.

BRIEF DESCRIPTION OF THE DRAWINGS

In the accompanying drawings forming a material part of this description, there is shown.

DESCRIPTION OF THE PREFERRED EMBODIMENTS

Figure 1:
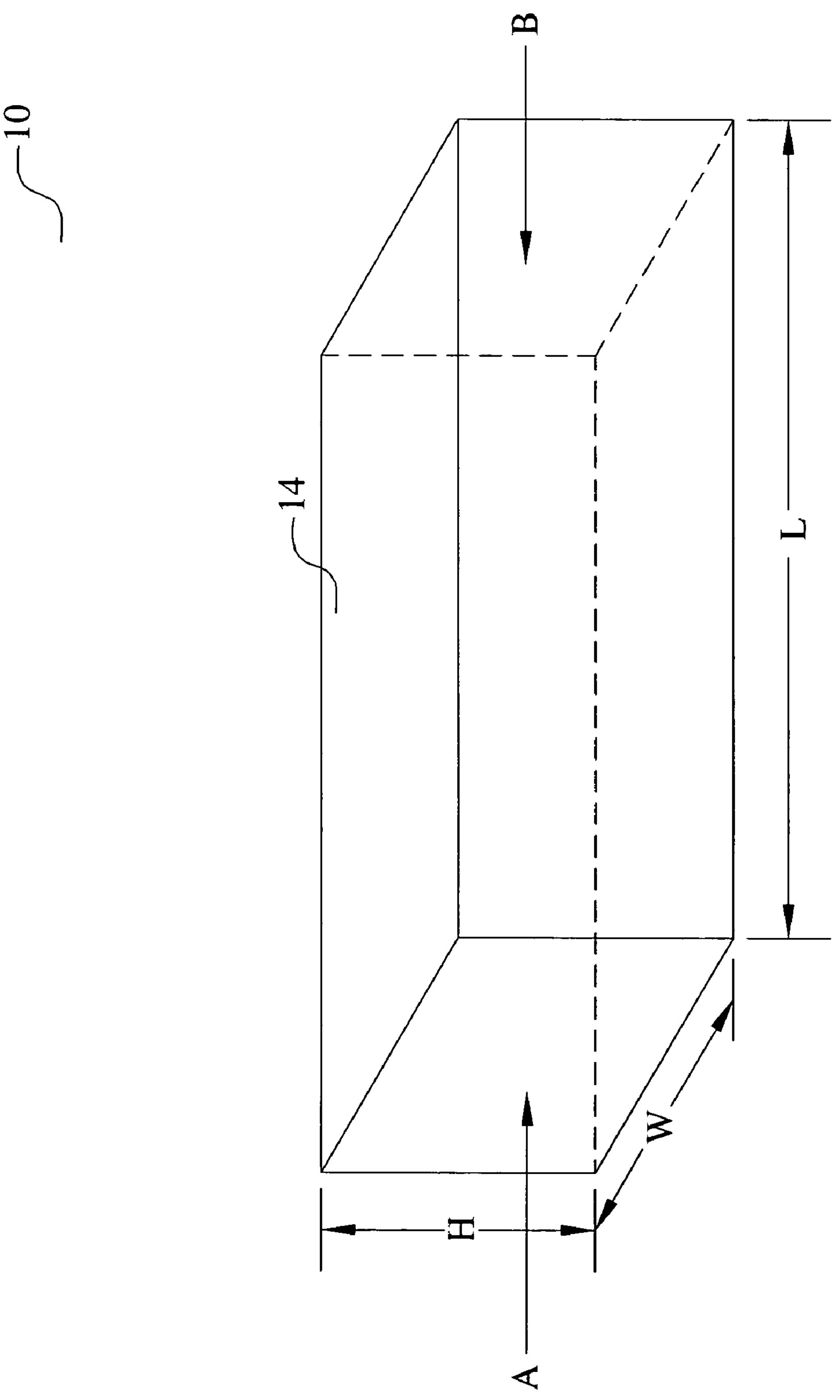
FIG. 1 illustrate a first preferred embodiment of the present invention showing resistors comprising a conductive loaded resin-based material.

This invention relates to resistors molded of conductive loaded resin-based materials comprising micron conductive powders, micron conductive fibers, or a combination thereof, homogenized within a base resin when molded.

The conductive loaded resin-based materials of the invention are base resins loaded with conductive materials, which converts the base resin from an insulator into a conductor. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of resistors fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the resistor devices are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of resistors significantly lowers the cost of materials and the design and manufacturing processes used to hold ease of close tolerances, by forming these materials into desired shapes and sizes. The resistors can be manufactured into infinite shapes and sizes using conventional forming methods such as injection molding, over-molding, or extrusion or the like. The conductive loaded resin-based materials, when molded, typically but not exclusively produce a desirable usable range of sheet resistance from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the heat sinks. The doping composition and directionality associated with the micron conductors within the loaded base resins can affect the electrical and structural characteristics of the resistors and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming resistors that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in resistor applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductor loaded resin-based material exhibits excellent thermal dissipation characteristics. Therefore, resistors manufactured from the molded conductor loaded resin-based material can provide added thermal dissipation capabilities to the application. For example, heat can be dissipated from electrical devices physically and/or electrically connected to resistors of the present invention.

As a significant advantage of the present invention, resistors constructed of the conductive loaded resin-based material can be easily interfaced to an electrical circuit or grounded. In one embodiment, a wire can be attached to a conductive loaded resin-based resistor via a screw that is fastened to the resistors. For example, a simple sheet-metal type, self tapping screw can, when fastened to the material, achieves excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made. For example, if the metal layer is solderable, then a soldered connection may be made between the resistors and a grounding wire.

Referring now to FIG. 1, a first preferred embodiment 10 of the present invention is illustrated. Several important features of the present invention are shown and discussed below. A resistor device 14 is shown. The resistor device 14 comprises the conductive loaded resin-based material according the present invention. The conductive loaded resin-based material forms a conductive network within the base resin matrix and, further, electrically interacts with the matrix to yield excellent bulk material properties including, but not limited to, low resistivity, excellent thermal conductivity, and excellent absorption of electromagnetic energy. Of particular importance to the present invention, the conductive material loading causes a substantial change in the bulk resistivity of the base resin material. It is well-known in the art of semiconductor manufacture, for example, that doping a semiconductor with a donor ion or an acceptor ion substantially alters the electrical characteristics of that semiconductor. In particular, the intrinsic bulk resistivity of the semiconductor is dramatically reduced. In a similar fashion, it is an important feature of the present invention to effectively dope the base resin material with the conductive loading material to thereby dramatically alter the electrical properties of the base resin.

The resulting bulk resistivity of the molded conductive loaded resin-based material that constitutes the resistor body 14 is substantially less than the bulk resistivity exhibited by molding the same base resin sans the conductive loading. Further, it is found that this bulk resistivity of the molded conductive loaded resin-based material 14 is established by the percentage, by weight, of conductive loaded material in the total conductive loaded resin-based molding material, prior to molding. That is, a well-controlled bulk resistivity value in the molded resistor body 14 is easily manufactured by carefully formulating the percent weight of conductive loading in the conductive loaded resin-based molding material. Further yet, by selecting the conductive loading percent, by weight, in the ranges as taught in the present invention, well-controlled and sufficiently large resistivity values are generated such that excellent resistor devices 14 of, for example, between about 1 Ω and about 10 MΩ, can be easily molded.

As described earlier, the actual value, in ohms, of the resistor device 14 depends on the resistivity (ρ) and on the cross sectional area-to-length ratio of the device structure. In this exemplary structure, the direction of current flow is between the first terminal end A and the second terminal end B. Therefore, the critical cross sectional area is defined as the product of the height H and the width W. The resistor length is defined by L. Therefore, the value of the resistor is calculated as:

$$R=\rho\times((H\times W)/L).$$

Figure 7A:
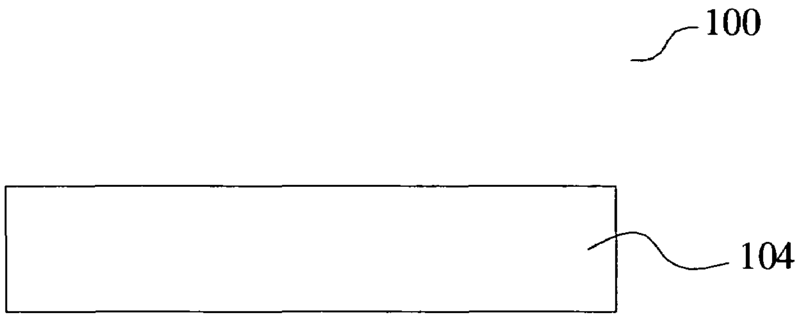
FIGS. 7*a* through 7*c* illustrate a second preferred embodiment of the present invention showing, in cross sectional representation, a resistor device of conductive loaded resin-based material with metal plated terminals.
Figure 7B:
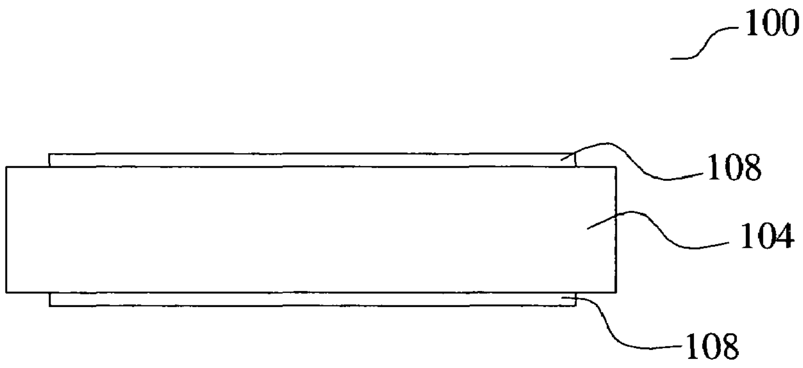
Figure 7C:
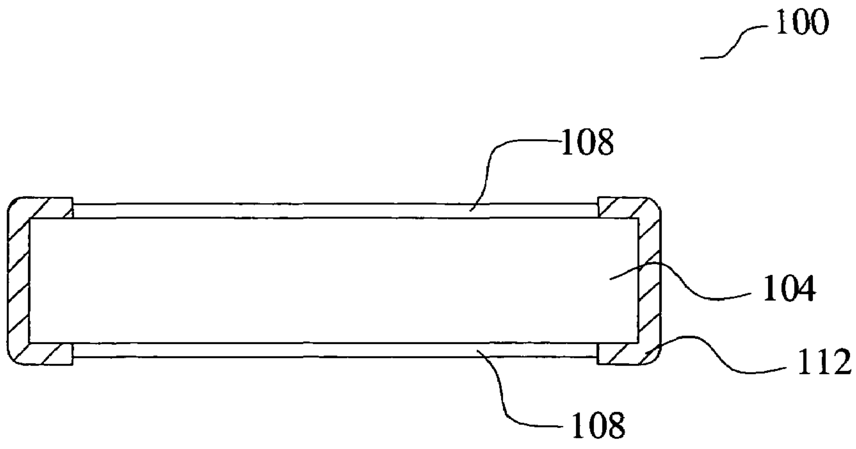

Referring now to FIGS. 7*a* through 7*b*, a second preferred embodiment 100 of the present invention is illustrated. In this embodiment, a resistor device 100 comprises a resistive element of conductive loaded resin-based material 104 having terminals comprising a metal layer 112. In this embodiment 100, the completed resistor as shown in FIG. 7*c* is particularly useful for surface mounting onto a circuit board, not shown. The metal layer 112 overlying the conductive loaded resin-based resistive element 104 of the resistor device 100 preferably comprises a solderable metal layer 112. The surface mountable resistor 100 according to the embodiment may be placed onto a circuit board and then soldered to that board by a solder reflow technique.

Referring again to FIG. 7*a*, as shown in cross sectional representation, a resistive element 104 is easily formed by molding the specially formulated conductive loaded resin-based material into the desired shape and size as shown in FIG. 7*a*. Since a metal layer will be plated onto the resistive element, a platable base resin material is used in the conductive loaded resin-based molding material. There are many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated.

Next, a plating resist layer 108 is applied to the resistive element 104 as is shown in FIG. 7*b*. The plating resistant layer 108 is formulated to not chemically bond with metal in the electroless plating or electroplating solution. As a further embodiment, the plating resistant layer 108 is an electrically insulating material that will prevent shorting of the resistive element 104 to the circuit board in the mounted position. An exemplary material for use as a plating resistant layer 108 is a solder resist material as is used in the fabrication of copper clad, resin-based circuit boards. In one embodiment, the plating resist layer 108 comprises a plating resistant ink that is selectively applied to the resistive element 104. The ink 108 may be selectively applied using a stencil that blocks the ink 108 from the terminal ends. After application, the plating resistant layer 108 is dried, or cured, as needed.

Referring now to FIG. 7*c*, a metal layer 112 is next plated onto the resistive element 108 where exposed by the plating resistant layer 108. In one embodiment, the metal layer 112 is formed by electroplating. In another embodiment, the metal layer 112 is formed by electroless plating. In yet another embodiment, the metal layer 112 is formed by a sequence of electroless plating followed by electroplating. In yet another embodiment, the metal layer 112 is formed by physical vapor deposition. In yet another embodiment, the metal layer 112 is formed by dipping or coating. In yet another embodiment, the metal layer 112 is formed by passing the resistive element through a molten metal wave or bath. The resulting resistor device 100 provides very low resistance contact terminals comprising the metal layer 112, a well-controlled resistance value in the resistive element 104, and, optionally, an insulator layer 108 to prevent shorting.

Figure 8A:
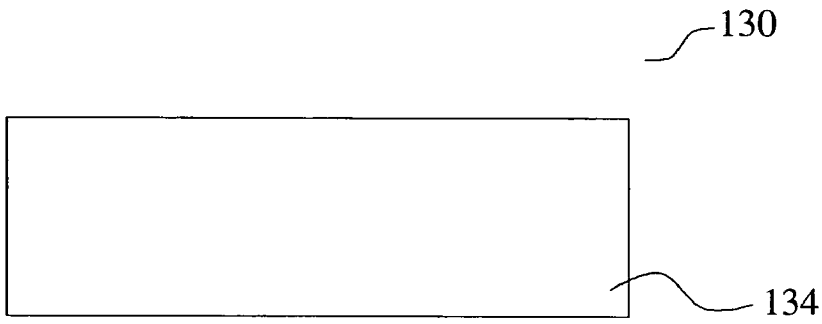
FIGS. 8*a* through 8*d* illustrate a third preferred embodiment of the present invention showing, in cross sectional representation, a resistor device of conductive loaded resin-based material with embedded metal terminals.
Figure 8B:
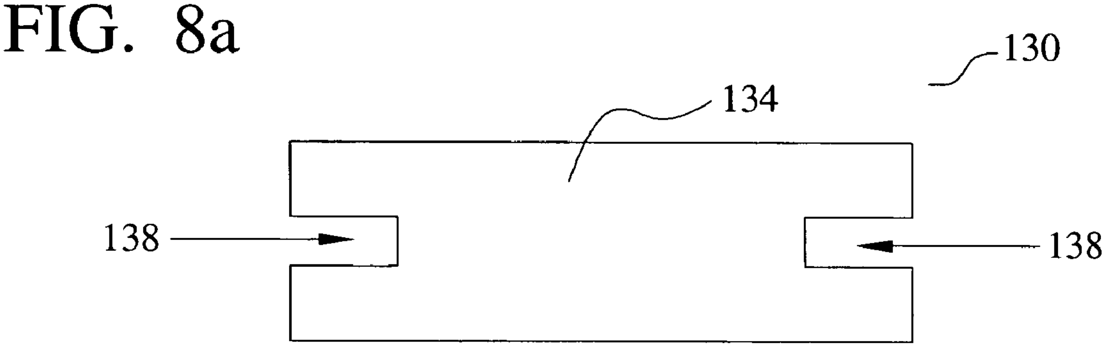

Referring now to FIGS. 8*a* through 8*d*, a third preferred embodiment of the present invention is illustrated. In this embodiment, a resistor device 130 with embedded metal contact terminals 146*a* and 146*b* is shown. Referring now to FIG. 8*a*, as shown in cross sectional representation, a resistive element 134 is easily formed by molding the specially formulated conductive loaded resin-based material into the desired shape and size. Since a metal layer will be plated into the resistive element, a platable base resin material is used in the conductive loaded resin-based molding material as described above. Referring now to FIG. 8*b*, holes or openings 138 are formed into the resistive element 134 according to one embodiment of the present invention. These holes 138 may be formed by drilling, stamping, punching, or the like. By forming the holes 138 after molding the resistive element 134, it is possible to create excellent interface locations along the sidewalls and bottoms of the holes to the conductive network in the matrix of the conductive loaded resin-based material. According to another embodiment, the holes or openings 138 are molded into the resistive element 134. This embodiment eliminates the need for separate processing steps to form the openings 138.

Figure 8C:
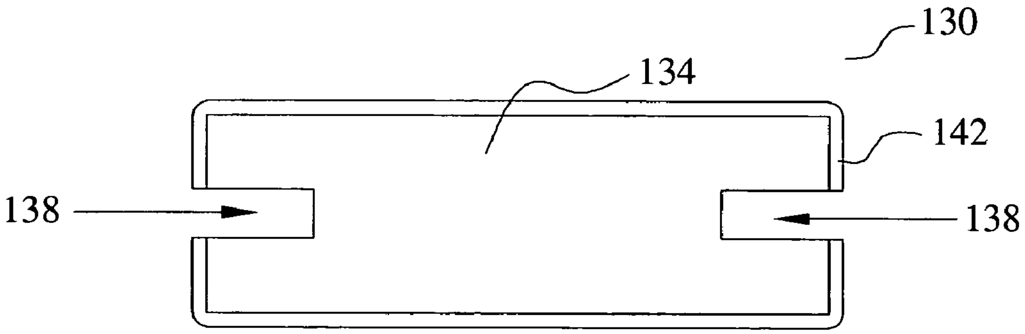

Referring now to FIG. 8*c*, a plating resistant layer 142 is applied to the resistive element 134. The plating resistant layer 142 is formulated to not chemically bond with metal in the electroless plating or electroplating solution. As a further embodiment, the plating resistant layer 142 comprises an electrically insulating material that will prevent shorting of the resistive element 134 to the circuit board in the mounted position. An exemplary material for use as a plating resistant layer is a solder resist material as is used in the formation of copper clad, resin-based circuit boards. In one embodiment, the plating resist layer 142 comprises a plating resistant ink that is selectively applied to the resistive element 134. The ink 142 may be selectively applied using a stencil that blocks the ink 142 from the terminal ends. After application, the plating resistant layer 142 is dried, or cured, as needed.

Figure 8D:
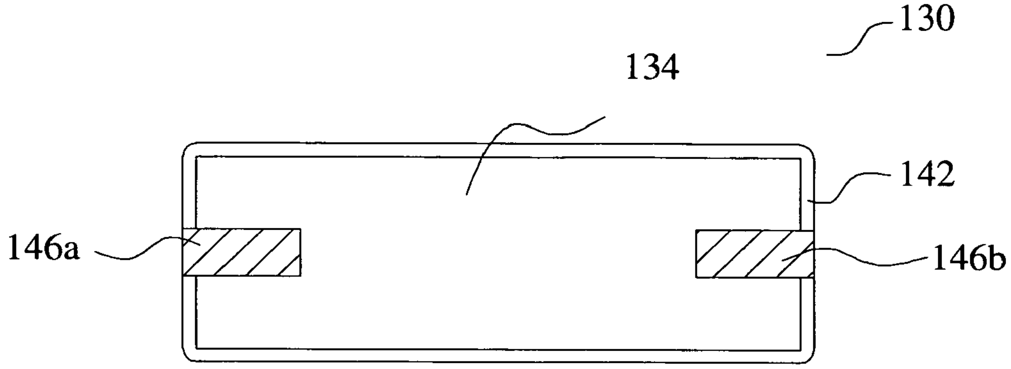

Referring now to FIG. 8*d*, a metal layer 146*a* and 146*b* is plated into the openings in the resistive element 134 that are exposed by the plating resistant layer 142. In one embodiment, the metal layer 146*a* and 146*b* is formed by electroplating. In another embodiment, the metal layer 146*a* and 146*b* is formed by electroless plating. In yet another embodiment, the metal layer 146*a* and 146*b* is formed by a sequence of electroless plating followed by electroplating. In yet another embodiment, the metal layer 146*a* and 146*b* is formed by physical vapor deposition. In yet another embodiment, the metal layer 146*a* and 146*b* is formed by dipping or coating. In yet another embodiment, the metal layer 146*a* and 146*b* is formed by passing the resistive element through a molten metal wave or bath. The resulting resistor device 130 provides very low resistance contact terminals comprising the metal layer 146*a* and 146*b*, a well-controlled resistance value in the resistive element 134, and, optionally, an insulator layer 142 to prevent shorting.

Figure 9:
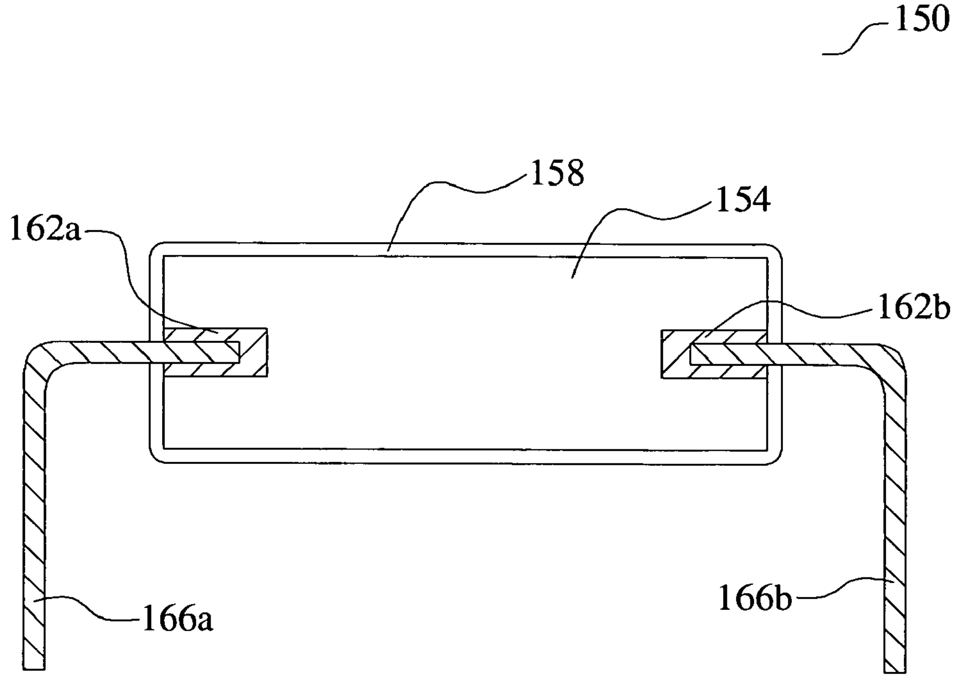
FIG. 9 illustrates a fourth preferred embodiment of the present invention showing, in cross sectional representation, a resistor device of conductive loaded resin-based material with embedded leaded terminals.

Referring now to FIG. 9, a fourth preferred embodiment 150 of the present invention is illustrated. A leaded resistor device 150 is shown. In this embodiment, the embedded metal layer concept of the third preferred embodiment is extended to further include embedding metal wires 166*a* and 166*b* into the embedded metal 162*a* and 162*b* of the terminals. A resistive element 154 again is molded of the specifically formulated conductive loaded resin-based material. Openings are formed into the resistive element 154 either by the molding process or by a subsequent manufacturing process as described above. A plating resistive layer 158 is formed overlying the resistive element 154. The plating resistive layer 158 further comprises insulating properties according to one preferred embodiment. A metal layer 162*a* and 162*b* is then preferably formed inside of the openings as described above. Finally, metal wiring leads 166*a* and 166*b* are embedded into the terminal openings. In one embodiment, the metal layer 162*a* and 162*b* comprises a solderable material such that the metal wiring leads will mechanically and electrically bond to the metal layer through, for example, a solder flowing step.

Figure 10:
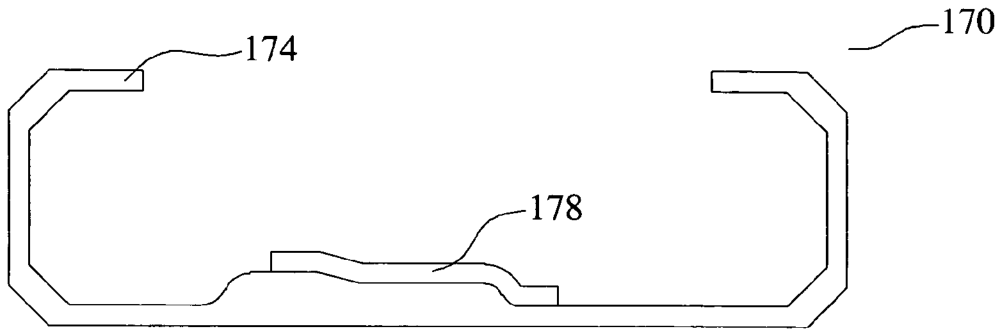
FIG. 10 illustrates a fifth preferred embodiment of the present invention showing, in cross sectional representation, an electronics package with a resistor device of conductive loaded resin-based material molded thereon.

The preferred embodiments of FIGS. 7*a* through 7*c*, 8*a* through 8*d*, and 9, are particularly useful for forming discrete resistor devices of the conductive loaded resin-based material of the present invention. Referring now to FIGS. 10, 11*a* through 11*b*, and 12, several embodiments of integrated resistor devices are illustrated. Referring particularly now to FIG. 10, a fifth preferred embodiment 170 of the present invention is illustrated in cross sectional representation. In this embodiment, a molded case or cover for an electrical or electronic device is shown. The molded case 174 comprises a moldable material. In one embodiment, the molded case 174 comprises a resin-based material. In another embodiment, the case comprises a conductive loaded resin-based material that is formulated for a very low resistivity.

As an important feature of the fifth preferred embodiment, a conductive loaded resin-based resistor device 178 is conformally over-molded onto the case 174. The conductive loaded resin-based material is specifically formulated with conductive loading, by weight, to achieve a resistivity in a particularly useful range for the planned resistor. The resistor device 178 is over-molded onto the case 174 using an injection molding technique. If the case 174 comprises the same base resin as is used in the resistor element 178, then excellent polymeric bonding should occur. Further, if the case 174 further comprises conductive loaded resin-based material with a relatively low resistivity, then the case 174 effective acts as a conductor that is now mechanically and electrically bonded to the resistor device 178.

Figure 11A:
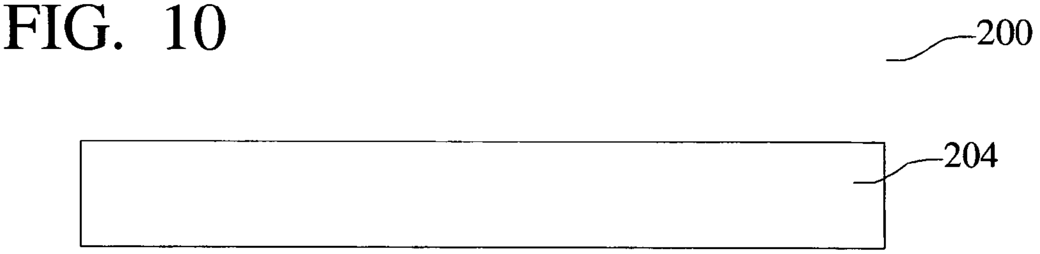
FIGS. 11*a* through 11*c* illustrate a sixth preferred embodiment of the present invention showing, in cross sectional representation, an circuit or wiring board with a resistor device of conductive loaded resin-based material molded thereon.
Figure 11B:
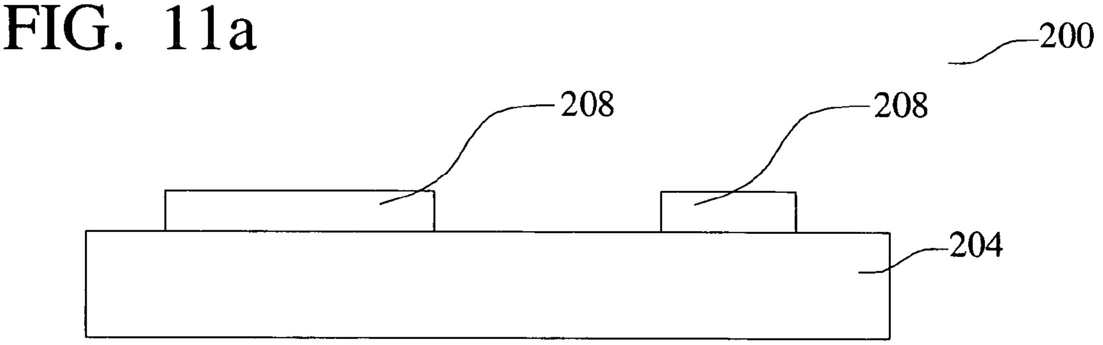
Figure 11C:
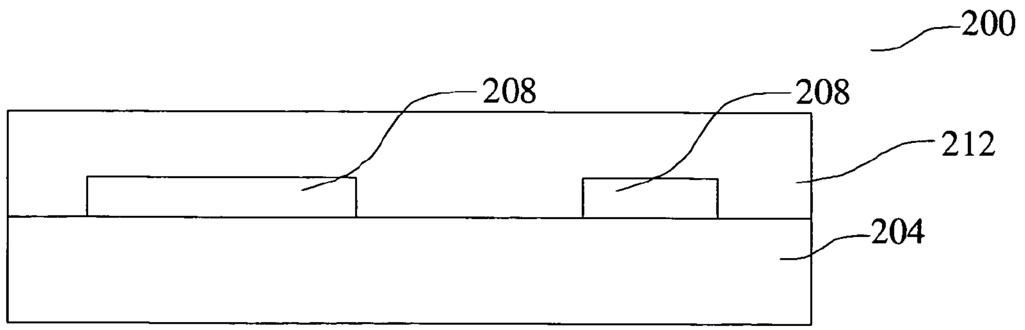

Referring now to FIGS. 11*a* through 11*c*, a sixth preferred embodiment of the present invention is illustrated in cross sectional representation. In this embodiment 200 a method to form an integrated resistor device 208 onto a circuit board substrate 204 is shown. Referring particularly to FIG. 11*a*, a circuit board substrate 204 is provided. The substrate 204 may comprise a resin-based material, a ceramic material, or the like. Referring now to FIG. 11*b*, a conductive loaded resin-based resistor device 208 is molded onto the substrate 204. In one embodiment, the conductive loaded resin-based material 208 is over-molded onto the substrate 204 by an injection molding process. The conductive loaded resin-based material is specifically formulated to achieve a useful resistivity range matched to the layout structure and to the intended resistance value. Referring now to FIG. 11*c*, following the molding of the resistor device 208, an insulating layer 212 is formed over the resistor 208. In one embodiment, this insulating layer 212 comprises a resin-based material. In another embodiment, this insulating layer 212 comprises the same resin based material used in the conductive loaded resin-based resistor 208.

Figure 12:
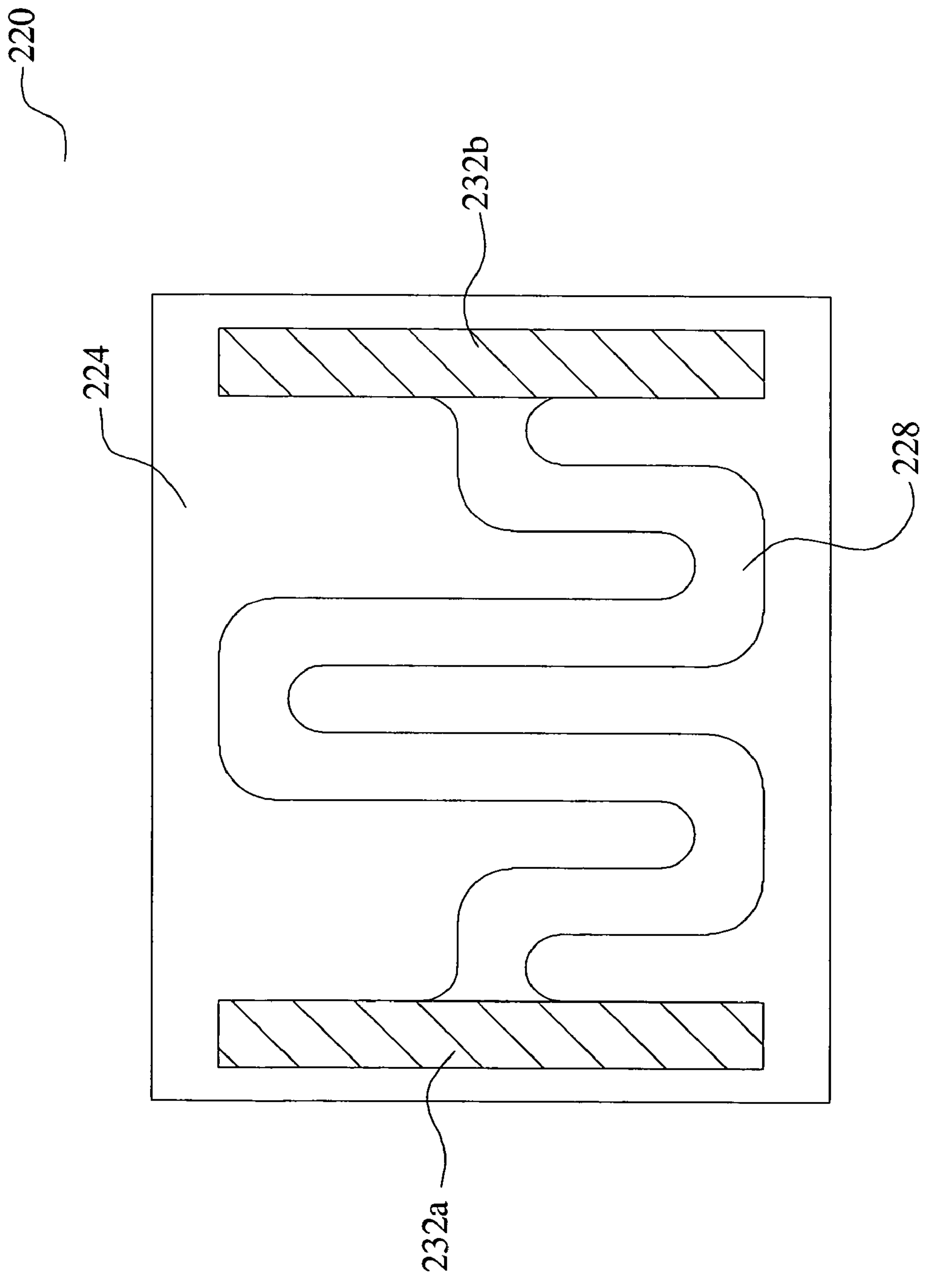
FIG. 12 illustrates a seventh preferred embodiment of the present invention showing, in top view, an circuit or wiring board with a resistor device of conductive loaded resin-based material molded thereon.

Referring now to FIG. 12, a seventh preferred embodiment 220 of the present invention is illustrated. In this embodiment, a top view of an integrated resistor device 220 is shown. As described in the previous embodiment, an integrated resistor device may be formed onto a substrate. In this embodiment, a conductive loaded resin-based resistive element 228 is over-molded onto a substrate 224. In this embodiment, the effective length of the resistor device 228, and therefore the effective resistor value, is increased by using a serpentine pattern as shown. A metal layer 232*a* and 232*b* is then plated onto the terminal ends of the resistor device to provide for excellent connectivity.

Figure 2:
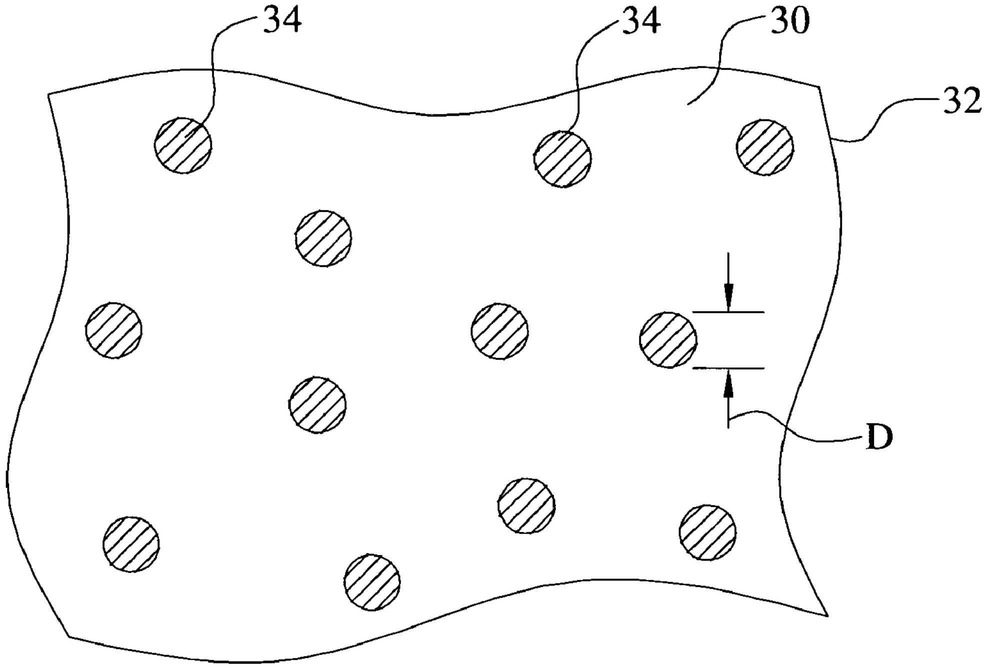
FIG. 2 illustrates a first preferred embodiment of a conductive loaded resin-based material wherein the conductive materials comprise a powder.

The conductive loaded resin-based material typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
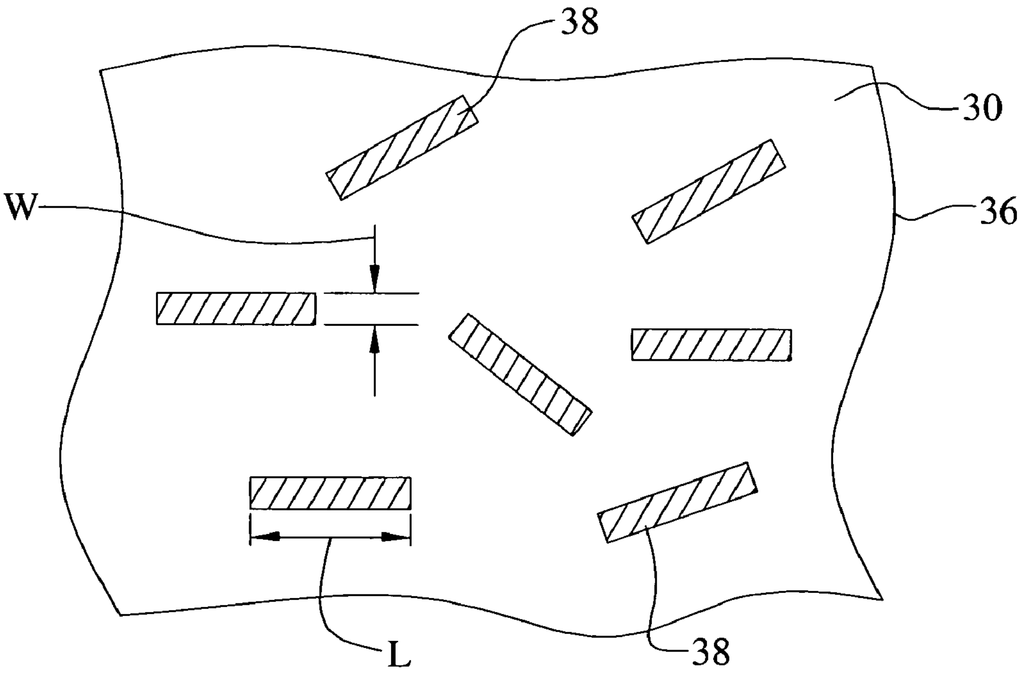
FIG. 3 illustrates a second preferred embodiment of a conductive loaded resin-based material wherein the conductive materials comprise micron conductive fibers.
Figure 4:
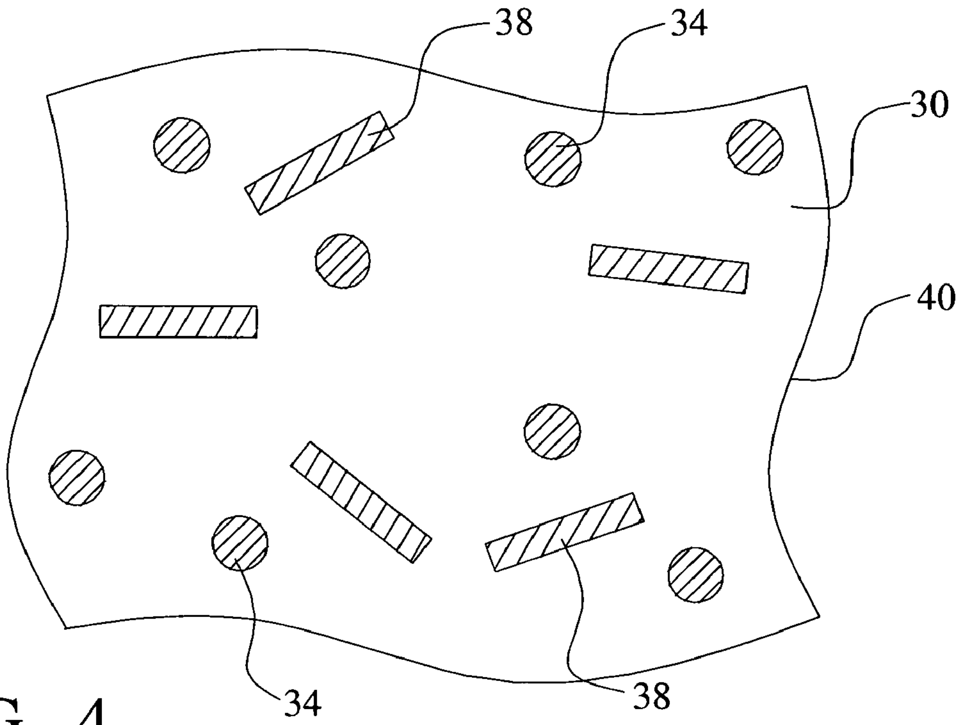
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a sheet resistance between about 5 and 25 ohms per square, other resistivities can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 8-11 micron in diameter and lengths of 4-6 mm and comprising, by weight, about 30% of the total weight of the conductive loaded resin-based material will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
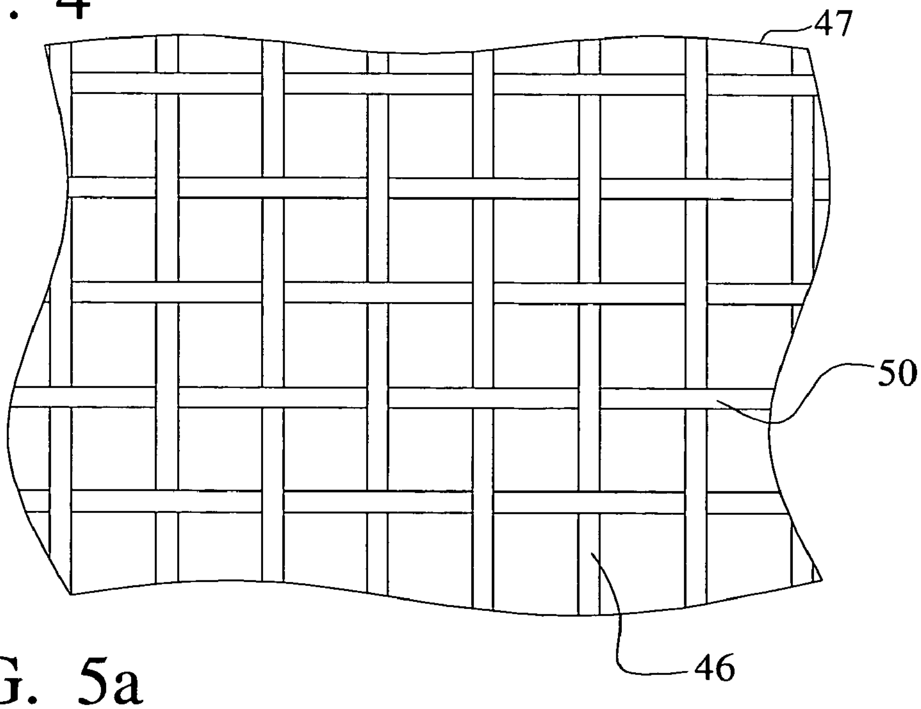
FIGS. 5*a* and 5*b* illustrate a fourth preferred embodiment wherein conductive fabric-like materials are formed from the conductive loaded resin-based material.
Figure 5B:
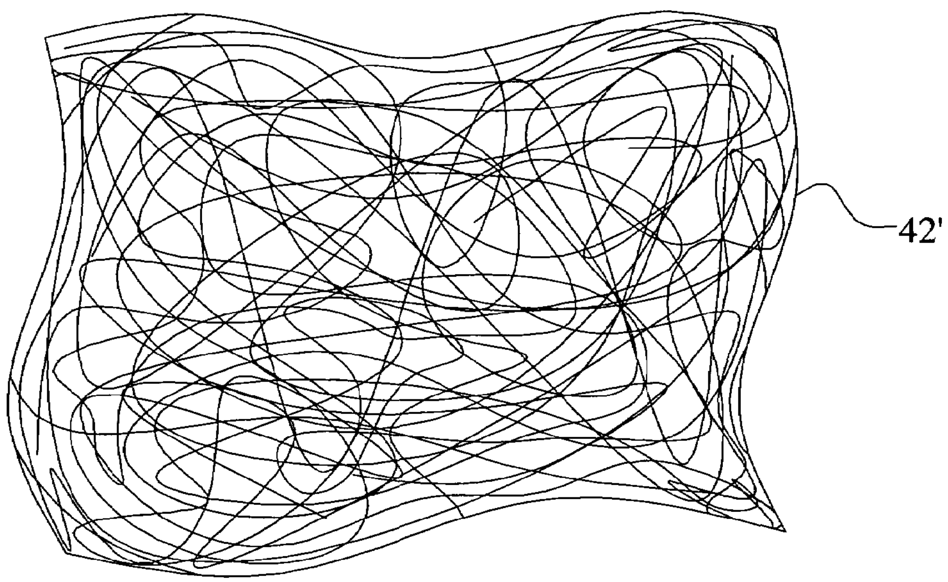

Referring now to FIGS. 5*a* and 5*b*, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5*a* shows a conductive fabric 42 where the fibers are woven together in a two-dimensional weave 46 and 50 of fibers or textiles. FIG. 5*b* shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5*a*, and 42', see FIG. 5*b*, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figure 6A:
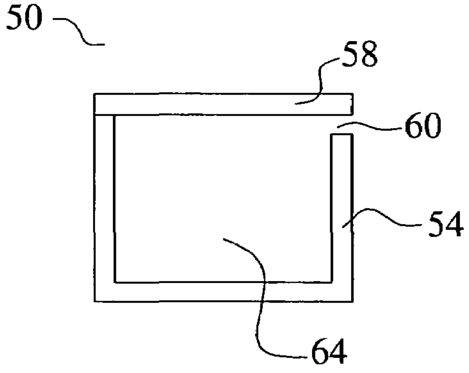
FIGS. 6*a* and 6*b* illustrate, in simplified schematic form, an injection molding apparatus and an extrusion molding apparatus that may be used to mold resistors of a conductive loaded resin-based material.

Resistors formed from conductive loaded resin-based materials can be formed or molded in a number of different ways including injection molding, extrusion or chemically induced molding or forming. FIG. 6*a* shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the resistors are removed.

Figure 6B:
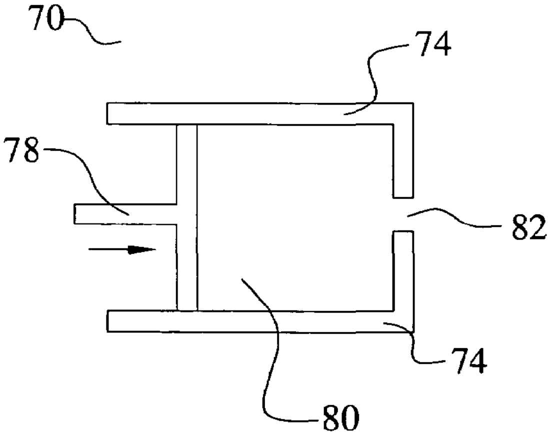

FIG. 6*b* shows a simplified schematic diagram of an extruder 70 for forming resistors using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. Effective and very manufacturable resistor devices are achieved. The resistors comprise conductive loaded resin-based material. Both discrete and integrated resistors are realized. Methods to form resistors of conductive loaded resin-based material are achieved. These methods are suitable for forming both discrete and integrated resistors. Resistors molded of conductive loaded resin-based material and further incorporating a metal layer to provide improved connectivity are achieved. Methods to fabricate resistors from a conductive loaded resin-based material incorporating various forms of the material are realized. Finally, a method is achieved to fabricate resistors from a conductive loaded resin-based material where the material is in the form of a fabric.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A resistor device comprising:

a resistive element comprising a conductive loaded, resin-based material comprising micron conductive fiber in a base resin host;

a first terminal connected at a first end of said resistor element; and a second terminal connected at a second end of said resistor element.

2. The device according to claim 1 wherein said micron conductive fiber comprise between about 20% and about 50% of the total weight of said conductive loaded resin-based material.

3. The device according to claim 1 wherein said micron conductive fiber comprise between about 20% and about 40% of the total weight of said conductive loaded resin-based material.

4. The device according to claim 1 wherein said micron conductive fiber comprise between about 25% and about 35% of the total weight of said conductive loaded resin-based material.

5. The device according to claim 1 wherein said micron conductive fiber comprise about 30% of the total weight of said conductive loaded resin-based material.

6. The device according to claim 1 wherein said conductive loaded resin-based material further comprises metal powder.

7. The device according to claim 6 wherein said metal powder is nickel, copper, or silver.

8. The device according to claim 6 wherein said metal powder is a non-conductive material with a metal plating.

9. The device according to claim 8 wherein said metal plating is nickel copper, silver, or alloys thereof.

10. The device according to claim 6 wherein said metal powder comprises a diameter of between about 3 μm and about 12 μm.

11. The device according to claim 1 wherein said conductive loaded resin-based material further comprises non-metal powder.

12. The device according to claim 11 wherein said non-metal powder is carbon, graphite, or an amine-based material.

13. The device according to claim 1 wherein said conductive loaded resin-based material further comprises a combination of metal powder and non-metal powder.

14. The device according to claim 1 wherein said micron conductive fiber is nickel plated carbon fiber, stainless steel fiber, copper fiber, silver fiber or combinations thereof.

15. The device according to claim 1 wherein said micron conductive fiber has a diameter of between about 3 μm and about 12 μm and a length of between about 2 mm and about 14 mm.

16. The device according to claim 1 further comprising an electrically insulating layer surrounding said resistive element.

17. The device according to claim 16 wherein said electrically insulating layer is a resin-based material.

18. The device according to claim 16 wherein said resistive element and said electrically insulating layer are flexible.

19. The device according to claim 1 further comprising a metal layer overlying a part of said resistive element wherein said metal layer forms one of said terminals.

20. The device according to claim 1 further comprising a metal layer embedded in said resistive element wherein said metal layer forms one of said terminals.

21. The device according to claim 1 further comprising a metal wire embedded in said resistive element wherein said metal wire forms one of said terminals.

22. The device according to claim 1 further comprising:
- a metal layer embedded in said resistive element; and
- a metal wire embedded in said metal layer wherein said metal wire forms one of said terminals.

23. The device according to claim 1 wherein said resistive element comprises a serpentine pattern.

24. The device according to claim 1 wherein said resistive element topography conforms to the shape of an underlying circuit board or package.

25. A resistor device comprising:
- a resistive element comprising a conductive loaded, resin-based material comprising micron conductive fiber in a base resin host;
- a first terminal comprising a metal wire embedded in said resistive element; and
- a second terminal connected at a second end of said resistor element.

26. The device according to claim 25 wherein said micron conductive fiber comprise between about 25% and about 35% of the total weight of said conductive loaded resin-based material.

27. The device according to claim 25 wherein said micron conductive fiber comprise about 30% of the total weight of said conductive loaded resin-based material.

28. The device according to claim 25 wherein said conductive loaded resin-based material further comprises metal powder.

29. The device according to claim 28 wherein said metal powder is a non-conductive material with a metal plating.

30. The device according to claim 28 wherein said metal powder comprises a diameter of between about 3 μm and about 12 μm.

31. The device according to claim 25 wherein said conductive loaded resin-based material further comprises non-metal powder.

32. The device according to claim 25 wherein said conductive loaded resin-based material further comprises a combination of metal powder and non-metal powder.

33. The device according to claim 25 wherein said micron conductive fiber has a diameter of between about 3 μm and about 12 μm and a length of between about 2 mm and about 14 mm.

34. The device according to claim 25 further comprising an electrically insulating layer surrounding said resistive element.

35. The device according to claim 34 wherein said electrically insulating layer is a resin-based material.

36. The device according to claim 34 wherein said resistive element and said electrically insulating layer are flexible.

37. The device according to claim 25 further comprising a metal layer overlying a part of said resistive element wherein said metal layer forms one of said terminals.

38. The device according to claim 25 further comprising a metal layer embedded in said resistive element wherein said metal layer forms one of said terminals.

39. The device according to claim 25 further comprising:
- a metal layer embedded in said resistive element; and
- a metal wire embedded in said metal layer wherein said metal wire forms one of said terminals.

40. The device according to claim 25 wherein said resistive element comprises a serpentine pattern.

41. The device according to claim 25 wherein said resistive element topography conforms to the shape of an underlying circuit board or package.

* * * * *